United States Patent [19]

Tomono et al.

[11] Patent Number: 5,838,409
[45] Date of Patent: Nov. 17, 1998

[54] LIQUID CRYSTAL DEVICE SUBSTRATE, LIQUID CRYSTAL DEVICE, AND METHOD AND APPARATUS FOR MANUFACTURING THE SAME

[75] Inventors: Haruo Tomono, Machida; Masaru Kamio, Sagamihara; Hiroyuki Tokunaga, Fujisawa; Yuji Matsuo, Kawasaki, all of Japan

[73] Assignee: Canon Kabushiki Kaisha, Tokyo, Japan

[21] Appl. No.: 742,050

[22] Filed: Nov. 1, 1996

[30] Foreign Application Priority Data

Nov. 9, 1995 [JP] Japan ................................. 7-291148
Oct. 9, 1996 [JP] Japan ................................. 8-268238

[51] Int. Cl.⁶ ................... G02F 1/1333; G02F 1/1343; G02F 1/13
[52] U.S. Cl. .......................... 349/122; 349/148; 349/187
[58] Field of Search .................................. 349/148, 187, 349/122

[56] References Cited

U.S. PATENT DOCUMENTS

| | | | |
|---|---|---|---|
| 4,712,874 | 12/1987 | Sekimura et al. | 350/339 F |
| 4,714,636 | 12/1987 | Yokono et al. | 428/1 |
| 4,728,176 | 3/1988 | Tsuboyama et al. | 349/148 |
| 4,744,637 | 5/1988 | Sekimura et al. | 350/339 R |
| 4,786,148 | 11/1988 | Sekimura et al. | 350/339 F |
| 4,793,692 | 12/1988 | Kamio et al. | 350/311 |
| 4,802,743 | 2/1989 | Takao et al. | 350/339 F |
| 4,818,075 | 4/1989 | Takao et al. | 350/339 F |
| 4,917,471 | 4/1990 | Takao et al. | 350/339 F |
| 5,078,475 | 1/1992 | Sekimura et al. | 359/68 |
| 5,101,289 | 3/1992 | Takao et al. | 359/68 |
| 5,212,575 | 5/1993 | Kojima et al. | 349/148 |
| 5,398,126 | 3/1995 | Takao et al. | 359/68 |

FOREIGN PATENT DOCUMENTS 6-347810 12/1994 Japan.

*Primary Examiner*—Anita Pellman Gross
*Attorney, Agent, or Firm*—Fitzpatrick, Cella, Harper & Scinto

[57] ABSTRACT

A UV resin is set between a surface of a substrate having a wiring pattern formed thereon and a flat surface of a mold plate, and the resultant structure is inserted between a pair of rollers and pressed to join the substrate to the mold plate. After the UV resin is cured, the mold plate is separated, thereby manufacturing a buried wiring substrate as a liquid crystal display device substrate.

31 Claims, 14 Drawing Sheets

LIQUID CRYSTAL DEVICE SUBSTRATE, LIQUID CRYSTAL DEVICE, AND METHOD AND APPARATUS FOR MANUFACTURING THE SAME

BACKGROUND OF THE INVENTION

1. Field of the Invention

The present invention relates to a liquid crystal device substrate, a liquid crystal device, and a method and apparatus for manufacturing the same.

2. Related Background Art

A conventional electrode substrate for a liquid crystal display device has a structure in which a transparent electrode of, e.g., an ITO (Indium Tin Oxide: a mixture of indium oxide and tin oxide, containing 5% to 10% of tin oxide) film on the surface of a glass substrate. However, the transparent electrode has a high resistance (volume resistance: 200 to $4,000 \times 10^{-8} \Omega$). For this reason, in increasing the display area, the precision, and the liquid crystal driving speed, a delay in the voltage waveform of a pulse signal for driving the liquid crystal in the device panel poses a problem. A thick transparent electrode may be formed to lower the resistance of the electrode. In this case, however, time and cost are required for film formation, and adhesion to the substrate deteriorates.

To solve these problems, a substrate has been proposed in which a metal electrode is formed under a thin transparent electrode (Japanese Patent Application Laid-Open No. 6-347810). More specifically, a low-resistance buried wiring substrate is manufactured in advance by burying a metal wiring pattern in a substrate on which a transparent electrode of, e.g., an ITO film is to be formed, and a transparent electrode of, e.g., an ITO film is formed on the metal wiring pattern which is exposed to the surface of the substrate.

A method of manufacturing this substrate is shown in (a) to (h) in FIG. 10. As shown in (a) in FIG. 10, a liquid resin monomer (to be simply referred to as a "resin" hereinafter) 55 such as a UV (ultraviolet) curing resin is dropped in a predetermined amount on a flat surface of a mold 51 by using a fixed quantity dropping jig such as a dispenser 56. Next, as shown in (b) and (c) in FIG. 10, a wiring substrate 54 in which metal wiring patterns 53 each having a thickness of about 1 μm are formed on a surface of a glass plate 52 in advance is set such that the resin 55 is sandwiched between the wiring surface of the wiring substrate 54 and the mold 51.

As shown in (d) in FIG. 10, the integral structure of the mold 51, the wiring substrate 54, and the resin 55 sandwiched therebetween is inserted between upper and lower plates 57 of a press machine or the like. As shown in (e) in FIG. 10, a pressure 58 is applied to join the mold 51 to the wiring substrate 54 through the upper and lower plates 57. The metal wiring patterns 53 and transparent electrodes 62 ((h) in FIG. 10) of, e.g., ITO films formed on the metal wiring patterns 53 in the subsequent process must maintain electrical connection therebetween. For this reason, the mold 51 must be firmly and uniformly joined to the entire surface of the wiring substrate 54 such that the resin 55 is removed from the surface of the metal wiring pattern 53 or only a very thin film of the resin 55 remains.

To cure this resin 55, as shown in (f) in FIG. 10, pressing is temporarily stopped, the integral structure of the mold 51 and the wiring substrate 54 is taken out from the upper and lower plates 57 of the press machine, and the resin 55 is cured by irradiating UV light 59 thereon. Finally, as shown in (g) in FIG. 10, the integral structure of the wiring substrate 54 and the resin 55 is separated from the mold 51 in a direction indicated by an arrow 60 by using a release unit (not shown), thereby obtaining a buried wiring substrate 61 as a liquid crystal device substrate shown in (h) in FIG. 10. The transparent electrodes 62 of, e.g., ITO films indicated by alternate long and two dashed lines in (h) in FIG. 10 are formed on the substrate 61 in the subsequent process.

In the conventional manufacturing method, however, a large pressure and long time are required to spread the resin 55 between the mold 51 and the wiring substrate 54 in the process shown in (e) in FIG. 10. More specifically, when the substrate 54 is small, the press time may be short. As the substrate 54 becomes larger, the press time becomes extremely longer in proportion to the square of the distance of flow of the resin 55, resulting in a decrease in manufacturing efficiency. For example, when the size of the substrate is 100 mm square, and the pressure is several ten $kg/cm^2$, the process takes a press time of several minutes. However, when the size of the substrate 54 is 300 mm square, a press time of several ten minutes, i.e., about ten times the above press time is required.

Theoretically, the pressure may be increased in order to solve this problem. However, for a large substrate, a press machine with large load is necessary, resulting in large-scale facilities. In addition, to uniformly spread the resin 55, the upper and lower plates 57 in a large size and excellent in flatness must be specially prepared by polishing and attached to the press machine, resulting in an increase in facility cost. As the pressure increases, the glass plate 52 of the wiring substrate 54 breaks more easily to result in a low yield. Furthermore, pressing a large area at once tends to generate pressure variations, so the resin on the wiring surface cannot be completely removed, resulting in a failure in electrical connection to the transparent electrodes 62.

If an air bubble is involved in the resin 55 when the resin 55 is dropped as shown in (a) in FIG. 10, or the substrate 54 contacts the resin 55 as shown in (b) in FIG. 10, the air bubble in the resin 55 cannot be removed by the above method, resulting in a decrease in manufacturing yield.

SUMMARY OF THE INVENTION

It is an object of the present invention to provide a liquid crystal device substrate which can be manufactured within a short time with a high yield, a liquid crystal device, and a method and apparatus for manufacturing the same.

According to the present invention, there is provided a liquid crystal device substrate in which conductive patterns formed on a surface of a transparent substrate are buried flat with a resin material, wherein the resin material comprises a cured liquid resin material, and the liquid resin material is set between a flat surface of a mold substrate and the surface of the substrate, spread when the mold substrate and the substrate are substantially linearly pressed, and a pressed portion is moved from one side of the integral structure of the mold substrate and the substrate to the other side, and then cured, thereby forming the resin material upon separating the mold substrate.

According to the present invention, there is provided a liquid crystal device having a liquid crystal sandwiched between a pair of substrates, wherein at least one of the pair of substrates comprises a liquid crystal device substrate of the present invention, and a transparent electrode is formed on a surface of a resin material of the liquid crystal device substrate to be electrically connected to an exposed portion of a conductive pattern.

According to the first aspect of the present invention, there is provided a method of manufacturing a liquid crystal device substrate in which conductive patterns formed on a surface of a transparent substrate are buried flat with a resin material, comprising the steps of preparing a mold substrate having a flat surface, setting a liquid resin material between the surface of the substrate having the conductive patterns formed thereon and the surface of the mold substrate, substantially linearly pressing the substrate and the mold substrate to bring them into contact with each other, and moving a pressed portion from one side of the integral structure of the substrate and the mold substrate to the other side to join the substrate to the mold substrate, and curing the liquid resin material and then separating the mold substrate.

According to the second aspect of the present invention, there is provided a method of manufacturing a liquid crystal device substrate in which a transparent electrode is formed on a conductive pattern formed on a transparent substrate and electrically connected to the conductive pattern, comprising the steps of mounting a liquid resin material on the substrate having the conductive pattern formed thereon, and pressing the resin material flat by press means and forming an electrical connection portion to the transparent electrode on a surface of the conductive pattern.

According to the third aspect of the present invention, there is provided a method of manufacturing a liquid crystal device substrate in which a transparent electrode is formed on a conductive pattern formed on a transparent substrate and electrically connected to the conductive pattern, comprising the steps of mounting a liquid resin material on the substrate having the conductive pattern formed thereon, performing pressing by a roller to remove the resin material on the conductive pattern and form an exposed portion on at least part of a surface of the conductive pattern, and curing the resin material and then forming the transparent electrode to be electrically connected to the exposed portion of the conductive pattern.

According to the present invention, there is provided a method of manufacturing a liquid crystal device having a liquid crystal sandwiched between a pair of substrates, comprising the steps of manufacturing at least one of the pair of substrates by a method of manufacturing a liquid crystal device substrate of the present invention, and forming a transparent electrode on a surface of a resin material of the liquid crystal device substrate to be electrically connected to an exposed portion of a conductive pattern.

According to the present invention, there is provided an apparatus for manufacturing a liquid crystal device substrate in which conductive patterns formed on a surface of a transparent substrate are buried flat with a resin material, comprising a first operation mechanism for setting a liquid resin material between the surface of the substrate having the conductive patterns formed thereon and a flat surface of a mold substrate, a second operation mechanism for substantially linearly pressing the substrate and the mold substrate, between which the liquid resin material is sandwiched, to bring them into contact with each other, and moving a pressed portion from one side of the integral structure of the substrate and the mold substrate to the other side to join the substrate to the mold substrate, a third operation mechanism for curing the liquid resin material between the substrate and the mold substrate, which are joined to each other, and a fourth operation mechanism for separating the mold substrate after the resin material is cured.

According to the present invention, there is provided an apparatus for manufacturing a liquid crystal device having a liquid crystal sandwiched between a pair of substrates, comprising an apparatus for manufacturing a liquid crystal device substrate of the present invention, and a fifth operation mechanism for forming a transparent electrode to be electrically connected to an exposed portion of a conductive pattern on a surface of a resin material on a substrate which is manufactured using the apparatus for manufacturing the liquid crystal device substrate.

According to the present invention, a liquid resin material is set between the surface of a substrate on which conductive patterns are formed and the flat surface of a mold substrate. The resultant structure is substantially linearly pressed to bring them into contact with each other, and the pressed portion is moved from one side of the integral structure of the substrate and the mold substrate to the other side. The resin material is efficiently spread between the substrate and the mold substrate while preventing an air bubble formation in the resin. With this arrangement, the manufacturing time of a liquid crystal device substrate is shortened, and the yield is increased, thereby realizing an improved productivity.

DETAILED DESCRIPTION OF THE PREFERRED EMBODIMENTS

Figure 1A:
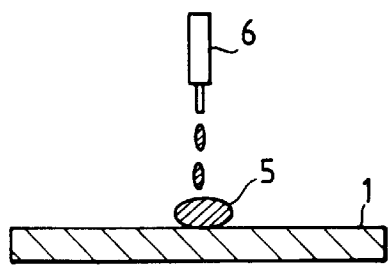
FIGS. 1a–1g are an explanatory view of the process of a manufacturing method according to the first embodiment of the present invention.
Figure 1B:
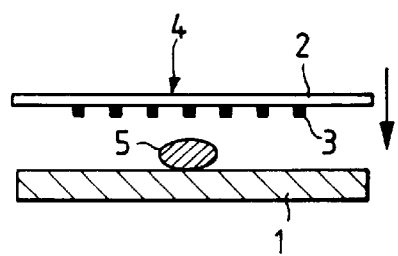
Figure 1C:
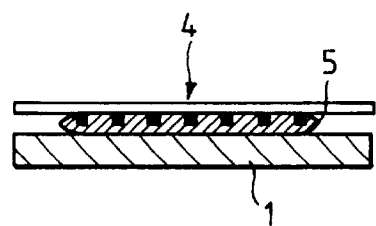
Figure 1D:
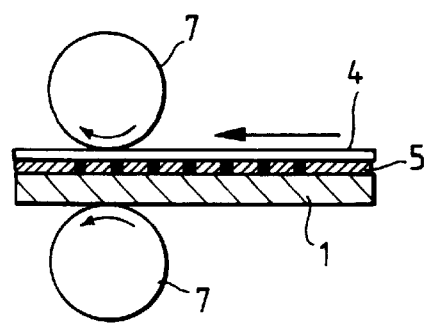
Figure 1E:
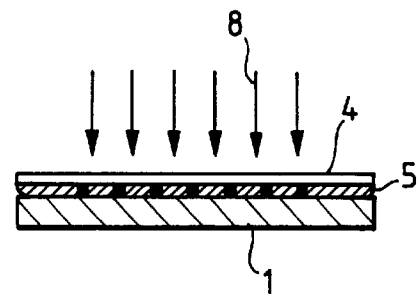
Figure 1F:
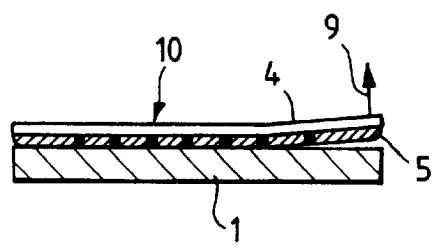
Figure 1G:
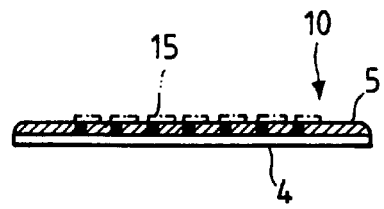

The embodiments of the present invention will be described below with reference to the accompanying drawings. As a liquid crystal device substrate and a liquid crystal device, a liquid crystal display device substrate and a liquid crystal display device will be exemplified. The present invention can also be applied to a liquid crystal device substrate and a liquid crystal device, which are used for a liquid crystal display device, a liquid crystal opto-electronics device, or a liquid crystal sensing device.

(First Embodiment)

The first embodiment of the present invention will be described below with reference to FIG. 1.

As shown in (a) in FIG. 1, a UV curing resin monomer liquid (to be simply referred to as a "resin" hereinafter) 5 is dropped in a predetermined amount on the surface of a mold 1 serving as a mold substrate with a flat surface by using a fixed quantity dropping jig such as a dispenser 6. As shown in (b) and (c) in FIG. 1, a metal wiring substrate 4 in which metal wiring patterns 3 each having a thickness of about 1 $\mu$m are formed on a surface of a glass substrate 2 in advance is set such that the resin 5 is sandwiched between the wiring surface of the wiring substrate 4 and the mold 1.

As shown in (d) in FIG. 1, the integral structure in which the resin 5 is sandwiched between the mold 1 and the wiring substrate 4 is inserted between a pair of rotating rollers 7 along a direction indicated by an arrow, so that the integral structure is pressed from its one side to join the respective parts. At this time, the resin 5 is removed from the surface of the metal wiring pattern 3, and the mold 1 is firmly and uniformly joined to the entire surface of the wiring substrate 4.

As shown in (e) in FIG. 1, UV light (ultraviolet) 8 is irradiated from the wiring substrate 4 side to cure the resin 5. Finally, as shown in (f) in FIG. 1, the integral structure of the wiring substrate 4 and the resin 5 is separated from the mold 1 by using a release jig (not shown) in a direction indicated by an arrow 9, thereby obtaining a buried wiring substrate 10 as a liquid crystal display device substrate shown in (g) in FIG. 1. Transparent electrodes 15 of, e.g., ITO films are formed on the substrate 10 in the subsequent process, as indicated by alternate long and two dashed lines in (g) in FIG. 1.

The mold 1 is a plate consisting of a metal, a glass material, or a ceramic material, and any material can be used as long as it has a high surface hardness and rigidity. The surface of the mold 1 is subjected to precision cutting, grinding, or polishing such that the flatness for a length of 100 mm falls within 10 $\mu$m, and preferably, within 2 $\mu$m.

The resin 5 comprises a mixture composition of a monomer or an oligomer as a UV curing resin and a light initiator as an organic substance for causing radical polymerization of the UV curing resin. Any polymerizable substance, i.e., acrylic-, epoxy-, or en/thiol-based resin can be used, though it must have heat resistance, chemical resistance, and resistance to rinsing to withstand the liquid crystal substrate manufacturing process, e.g., ITO sputtering film formation or alignment film annealing. As a light initiator, benzophenone, anthraquinone, acetophenone, or the like can be used. Normally, about 0.1% to 3% of a light initiator is mixed. For the resin 5, a molecular structure with heat resistance is preferably introduced to a reactive oligomer as a major component, or the crosslinking density is preferably increased by a polyfunctional monomer. The UV light 8 is used to cure the resin 5. However, the wavelength of light to be used is not limited to this, and any light such as visible light or infrared light may be used as long as the light can be transmitted through a transparent medium such as the substrate 2. Therefore, a resin 5 to be used is determined depending on the wavelength of light to be used. Alternatively, a resin which is cured by heat can be used as the resin 5.

The glass substrate 2 may be a glass material tipically used for a liquid crystal substrate, e.g., a sodalime glass plate having a thickness of about 1 mm. The glass substrate 2 preferably has a high parallelism by polishing both surfaces. The wiring pattern 3 preferably consists of aluminum, chromium, molybdenum, or copper, which exhibits a low resistivity, is easy to form a film with a thickness of about 1 $\mu$m, and has good adhesion to glass. To join the UV curing resin 5 to the surface of the wiring substrate 4, the surface of the wiring substrate 4 is preferably subjected to a joining process such as silane coupling in advance.

As the rollers 7, rollers normally used in an apparatus such as a roller coater, a laminator, or a printing press can be used, so that the apparatus may be used without modifications. Alternatively, only the roll press unit of the apparatus may be used, or rollers of special make may be used. Any rollers may be used as long as they can generate a pressure necessary to uniformly spread the resin 5 over the entire area of the liquid crystal substrate. The pressing mechanism normally generates a pressure of about 1 to 50 kg/cm$^2$, and preferably, about 5 to 20 kg/cm$^2$, and has an arrangement which allows pressure adjustment using a hydraulic cylinder or an air cylinder provided at the two ends of the shaft of the roller 7. In addition, the rollers 7 preferably have a stroke in the vertical direction such that the integral structure of the mold 1, the resin 5, and the wiring substrate 4 can be inserted between the upper and lower rollers 7.

The pressure to be applied by the rollers 7 may be smaller than that required to surface pressing in the prior art shown in (e) in FIG. 10. More specifically, pressing by the rollers 7 is so-called roll press, i.e., linear pressing. Therefore, the pressure necessary for a large-sized substrate 54 increases in proportion to not the second power but only the first power of the size of the substrate 54, unlike the prior art. When the rollers 7 are used, a bulky press machine is unnecessary, and a simple unit suffices.

Even if cells or bubbles are involved in the resin 5 in the processes shown in (a) and (b) in FIG. 1, the rollers 7 serve to squeeze the cells or bubbles in the resin 5 in the process shown in (d) in FIG. 1, and all cells or bubbles are removed.

When the rollers 7 are heated by providing electric heaters to the rollers 7, or passing a heated fluid through the rollers 7, the target press object, i.e., the integral structure of the mold 1, the substrate 4, and the resin 5 (to be also referred to as a "target press object" hereinafter) can be pressed while being heated in the process shown in (d) in FIG. 1. This is preferable because the viscosity of the resin 5 is decreased, and the resin 5 can be easily spread.

In addition, before the process in (d) in FIG. 1, the target press object is preferably heated by another heating unit such as a hot plate or an oven to sufficiently decrease the viscosity of the resin 5.

The UV lamp serving as the light source of the UV light 8 may be any one of a high-pressure mercury lamp, a low-pressure mercury lamp, and a xenon lamp as long as it can cure the resin 5 and has an illuminance sufficient for curing. However, the UV light 8 reaches the resin 5 through the wiring substrate 4, as shown in (e) in FIG. 1, and the illuminance decreases. When the illuminance of the UV light 8 irradiated on the resin 5 is lower than a desired illuminance, the structure may be temporarily separated from the mold, as shown in (f) in FIG. 1, before the resin 5 is completely cured in the process shown in (e) in FIG. 1, and the UV light 8 may be irradiated again in the state shown in (g) in FIG. 1 to completely cure the resin 5.

(Second Embodiment)

Figure 2A:
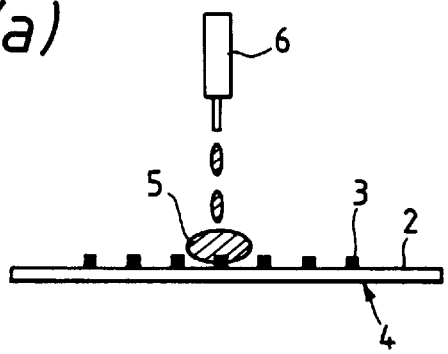
FIGS. 2a–2c are an explanatory view of the process of a manufacturing method according to the second embodiment of the present invention.
Figure 2B:
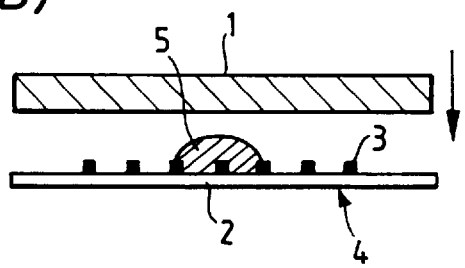
Figure 2C:
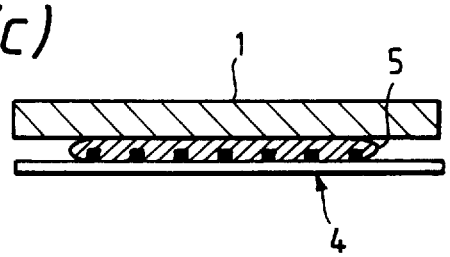

In the first embodiment, after the resin 5 is dropped on the mold 1, the substrate 4 is joined. However, the order of processes is not limited to this. After a resin 5 is dropped on a wiring substrate 4, as shown in (a) in FIG. 2, a mold 1 may be joined from the upper side, as shown in (b) and (c) in FIG. 2.

(Third Embodiment)

Figure 3A:
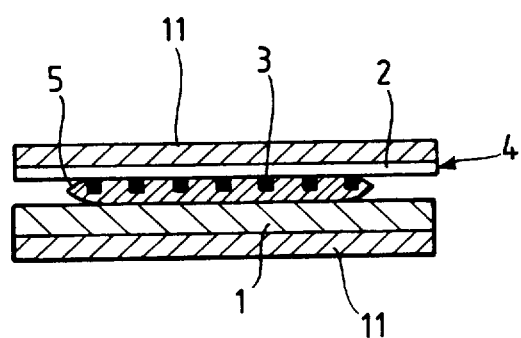
FIGS. 3a–3b are an explanatory view of the process of a manufacturing method according to the third embodiment of the present invention.
Figure 3B:
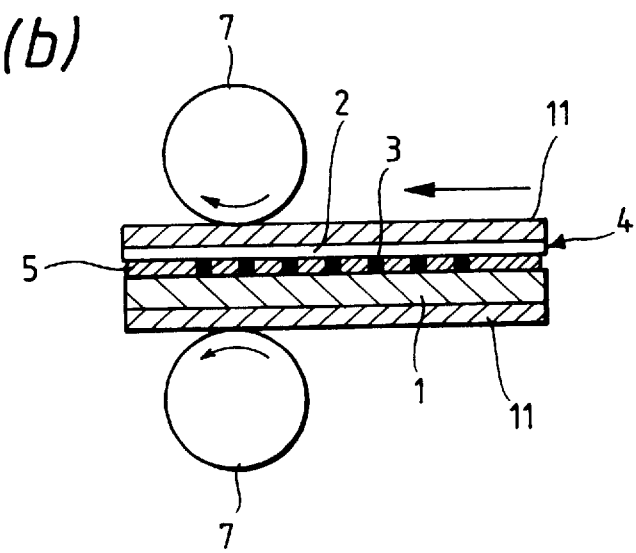

Before pressing using the rollers 7, as shown in (d) in FIG. 1, sheets 11 consisting of an elastic material such as a rubber or resin may be mounted on both a wiring substrate 4 and a mold 1, as shown in (a) in FIG. 3, and then, the integral structure may be inserted between the rollers 7, as shown in (b) in FIG. 3, and pressed. When a pressure is applied through the elastic sheet 11 of a rubber or resin instead of directly applying a pressure to a glass substrate 2 of the wiring substrate 4 or the mold 1 by the rollers 7, pressure variations due to the unevenness of the surface shapes of the rollers 7, the glass substrate 2, and the mold 1 or fine dust can be prevented. The resin 5 can be further uniformly spread, and additionally, the glass substrate 2 can be prevented from cracking due to pressure variations.

Any material can be used for the sheet 11 as long as it has sufficient elasticity and thickness for equalizing pressure variations. For example, silicone rubber, urethane rubber, acrylic rubber, thermoplastic elastomer, polyethylene, polypropylene, polytetrafluoroethylene, polyester, nylon, or polyurethane, can be used. The thickness is preferably about 0.1 to 10 mm, and more preferably, about 1 to 3 mm.

The sheets 11 need not always be arranged on both sides of the target press object. Depending on the degree of pressure variations, the sheet 11 may be arranged only on one side of the target press object.

(Fourth Embodiment)

Figure 4A:
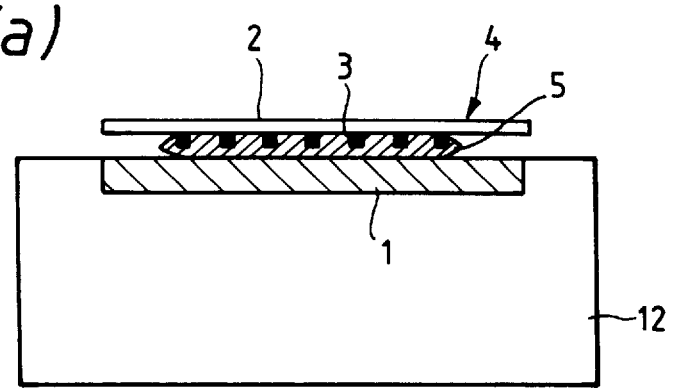
FIGS. 4a–4b are an explanatory view of the process of a manufacturing method according to the fourth embodiment of the present invention.
Figure 4B:
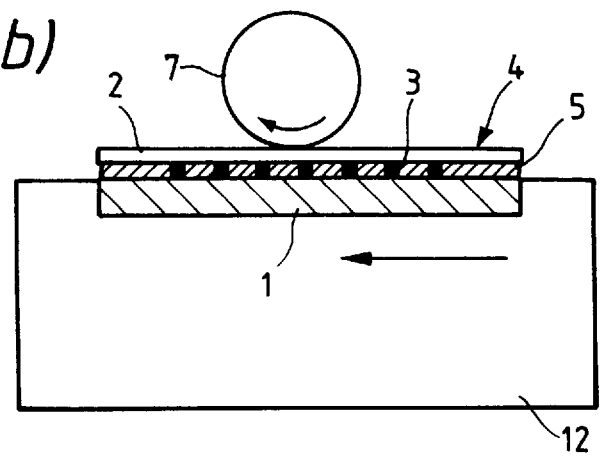

As shown in (a) in FIG. 4, a mold 1 is positioned and fixed in a holder 12. The integral structure is pressed only from the upper side by using one roller 7, as shown in (b) in FIG. 4. The holder 12 is moved in a direction indicated by an arrow shown in (b) in FIG. 4 in synchronism with the rotation of the roller 7. If the mold 1 is thick, it is difficult to insert the mold 1 between two rollers 7, as shown in (d) in FIG. 1. Therefore, this technique shown in (a) and (b) in FIG. 4 is more effective.

Not the mold 1 but a wiring substrate 4 may be fixed.

(Fifth Embodiment)

Figure 5:
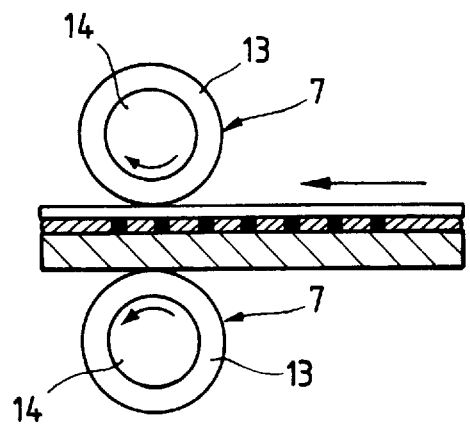
FIG. 5 is an explanatory view of the process of a manufacturing method according to the fifth embodiment of the present invention.

As shown in FIG. 5, rollers 7 each having an elastic sheet 13 consisting of, e.g., a rubber and wound thereon or tightly formed thereon are used. With this arrangement, the same effect as in the third embodiment can be obtained. The material and thickness of the sheet 11 of the third embodiment apply to the sheet 13 used in the fifth embodiment.

(Sixth Embodiment)

Figure 6A:
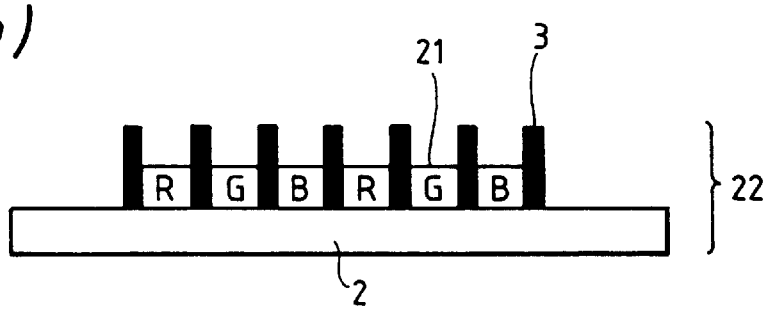
FIGS. 6a–6b are an explanatory view of the process of a manufacturing method according to the sixth embodiment of the present invention.
Figure 6B:
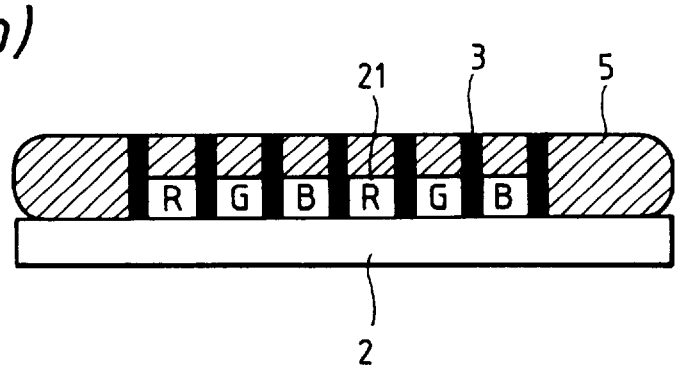

Instead of the wiring substrate 4 used in FIG. 1, a wiring substrate 22 as shown in (a) in FIG. 6 may be used. In the substrate 22, R, G, and B color filters 21 for a liquid crystal substrate are formed between metal wiring patterns 3 in advance by photolithography, printing, sublimation transfer, or an ink jet method. When the substrate 22 is used, a low-resistance wiring substrate as a liquid crystal display device substrate having a color filter function as shown in (b) in FIG. 6 can be manufactured.

(Seventh Embodiment)

Figure 7A:
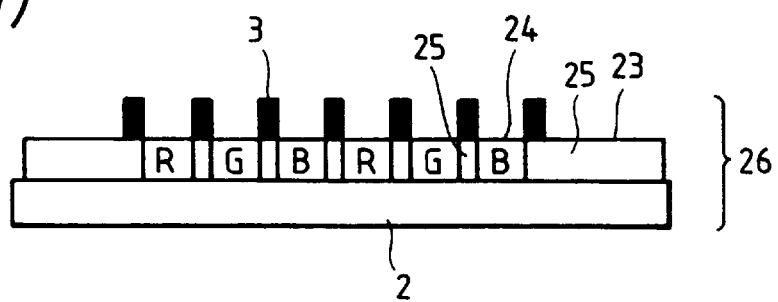
FIGS. 7a–7b are an explanatory view of the process of a manufacturing method according to the seventh embodiment of the present invention.
Figure 7B:
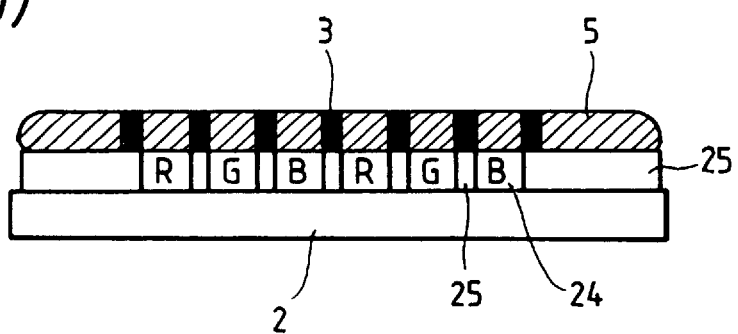

A wiring substrate 26 as shown in (a) in FIG. 7 may be used. In the substrate 26, a color filter layer 23 is formed on the surface of a glass substrate 2 in advance, and thereafter, metal wiring patterns 3 are formed. When the substrate 26 is used, a buried wiring substrate can be formed using a UV curing resin 5 or the like, as shown in (b) in FIG. 7.

When a color filter is to be formed by an ink jet method, i.e., by ejecting a dye ink 24, the entire surface is coated with a receptor layer 25 in advance by spin coating or the like. Thereafter, the dye ink 24 can be precisely ejected according to the pattern to penetrate into the receptor layer 25 in that pattern.

(Eighth Embodiment)

Figure 8A:
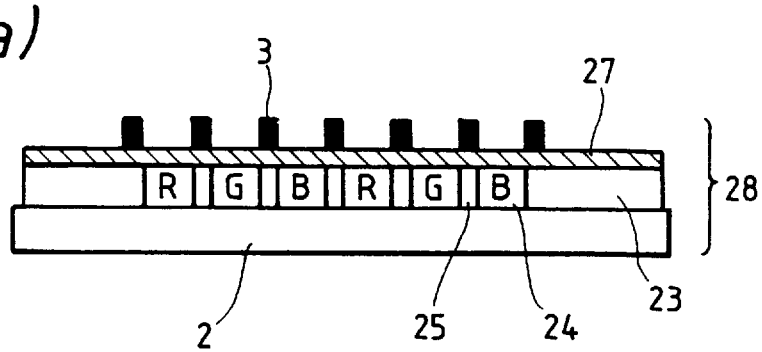
FIGS. 8a–8b are an explanatory view of the process of a manufacturing method according to the eighth embodiment of the present invention.
Figure 8B:
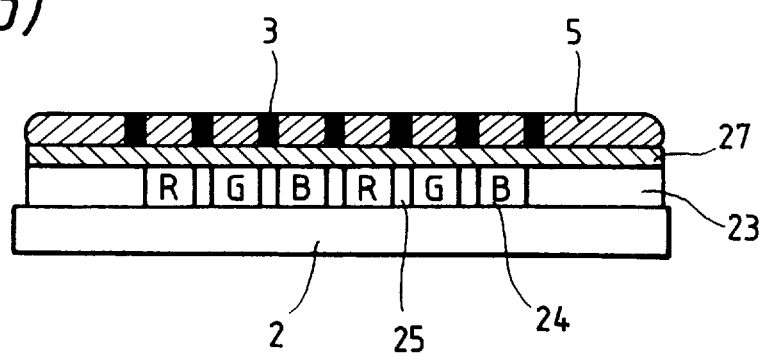

A wiring substrate 28 as shown in (a) in FIG. 8 may be used. In the substrate 28, a color filter layer 23 is formed on the surface of a glass substrate 2 in advance, a protective layer 27 is formed on the resultant structure, and then, metal wiring patterns 3 is formed. When the substrate 28 is used, a buried wiring substrate can be formed using an UV curing resin 5 or the like, as shown in (b) in FIG. 8.

In this case, when the metal wiring patterns 3 are formed by popular photolithography, the color filters can be prevented from being discolored by an etchant such as an acid.

(Ninth Embodiment)

Figure 9:
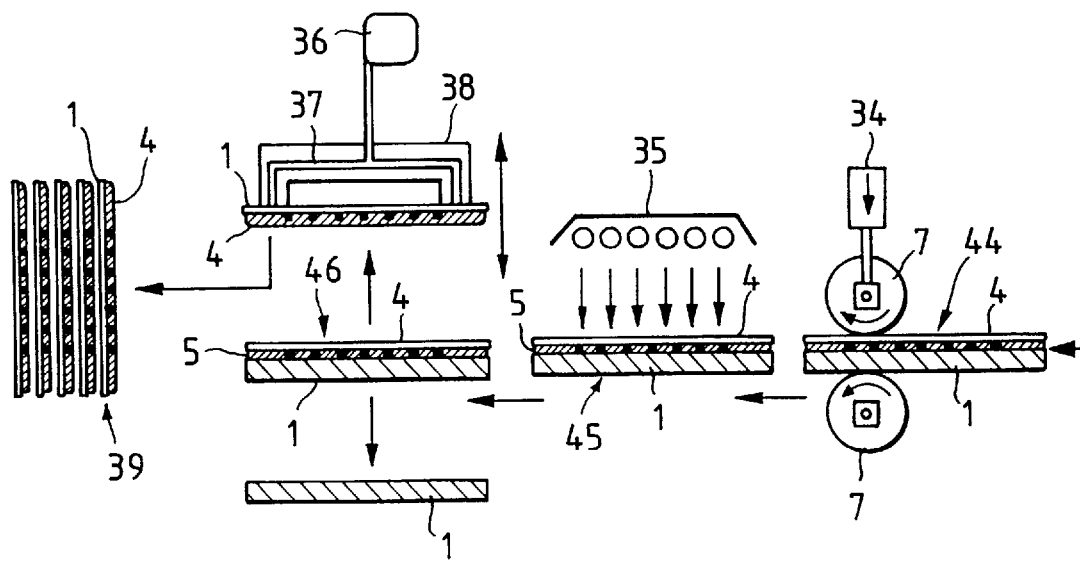
FIG. 9 is a schematic view of the arrangement of a manufacturing apparatus of the present invention.
Figure 9:
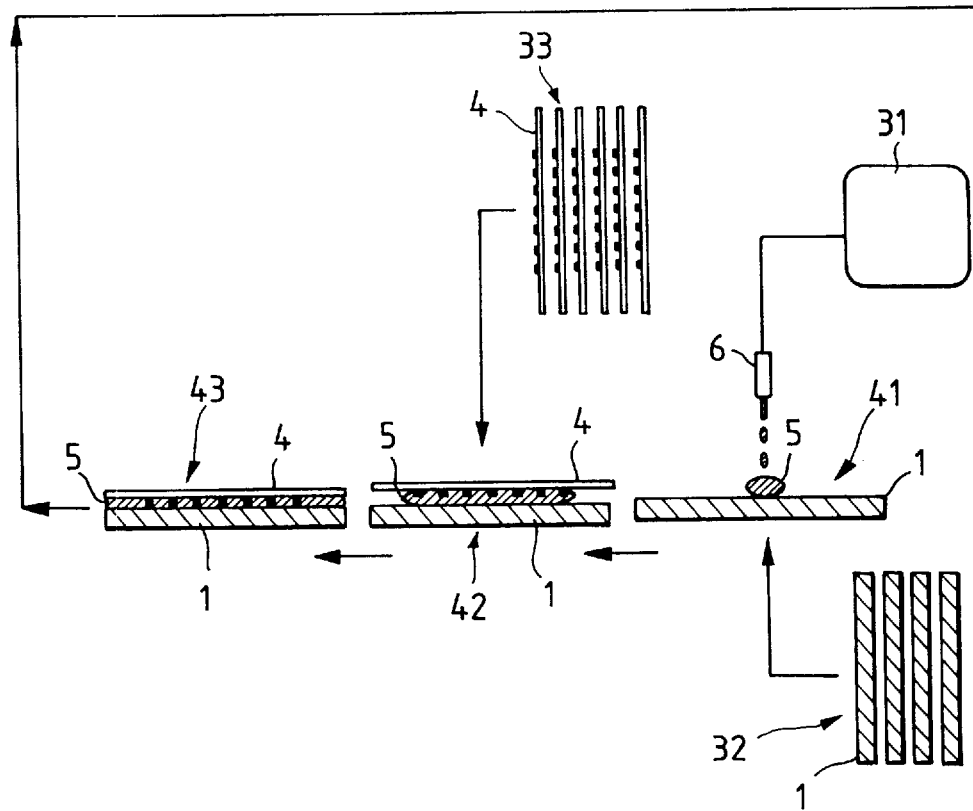
Figure 10A:
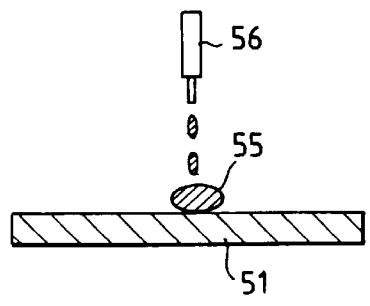
FIGS. 10a–10h are an explanatory view of the process of a conventional method of manufacturing a liquid crystal device substrate.
Figure 10E:
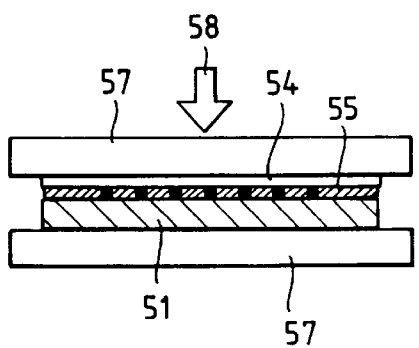
Figure 10B:
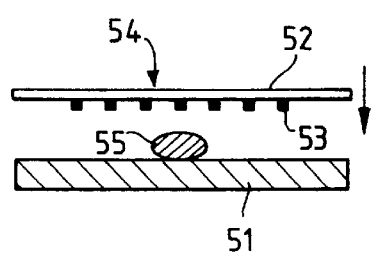
Figure 10F:
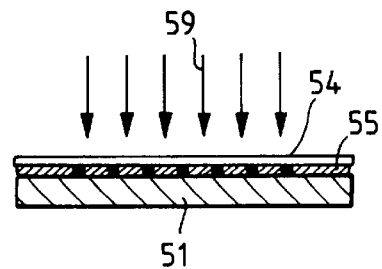
Figure 10C:
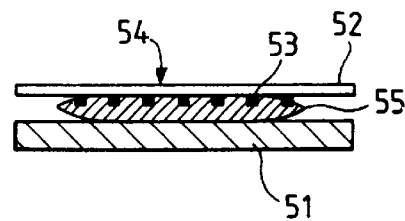
Figure 10G:
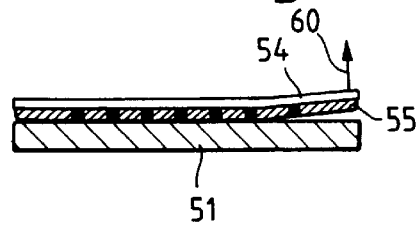
Figure 10D:
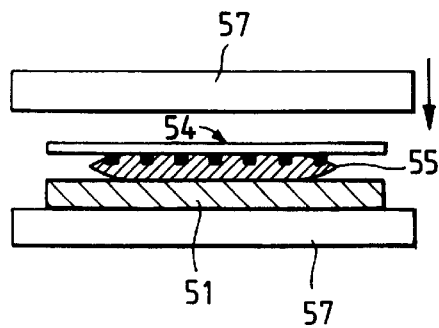
Figure 10H:
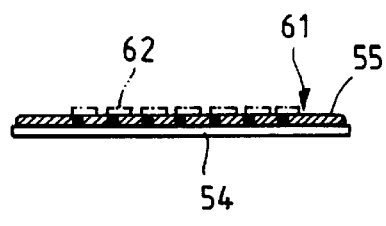

FIG. 9 is a schematic view of an example of an apparatus for manufacturing a liquid crystal display device substrate.

A mold 1 is supplied from a mold storage container 32 to a resin setting operation unit 41. A resin 5 supplied from a resin tank 31 is dropped from a dispenser 6 onto the mold 1. A wiring substrate 4 is supplied from a wiring substrate storage container 33 to a substrate/mold setting operation unit 42, and the resin is sandwiched between the mold 1 and the wiring substrate 4. The resultant structure may be left to stand for a while, as needed, until the resin 5 spreads to some extent. In addition, the integral structure (target press object) of the mold 1, the resin 5, and the substrate 4 may be heated by a heating operation unit 43, as needed.

Subsequently, the target press object is pressed by a roller press operation unit 44. At this time, the rotating shaft of a roller 7 is pressed in a direction indicated by an arrow by a press actuator 34. In addition, the rollers 7 are heated, as needed. Thereafter, UV light is irradiated by a UV lamp 35 of a UV irradiation unit 45 to cure the resin 5. Finally, using a vacuum chuck 38 which communicates with a vacuum passage 37 of a vacuum pump 36 in a release operation unit 46, the integral structure of the wiring substrate 4 and the cured resin 5 is released from the mold 1, as shown in FIG. 9, and the product is stored in a product storage container 39.

In the apparatus for performing the series of operations, the target object is sequentially conveyed by a conveyor or autohand robot (not shown) in accordance with the processes, and the operation is electrically automatically controlled by sequence control.

(Tenth Embodiment)

Figure 11:
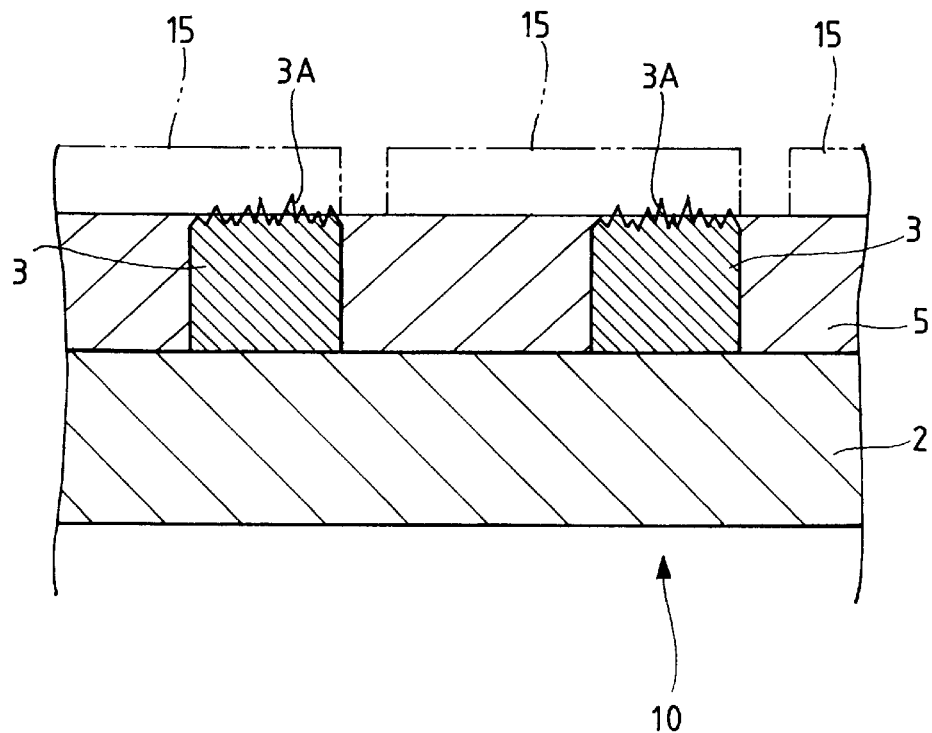
FIG. 11 is an enlarged sectional view of a liquid crystal display device substrate according to the tenth embodiment of the present invention.

FIG. 11 is an enlarged sectional view of an example of a liquid crystal display device substrate.

In this embodiment, the surface roughness of a metal wiring pattern 3 is set at a predetermined value in advance. With this arrangement, in the press process of removing a resin 5 from the surface of the metal wiring pattern 3, as shown in (d) in FIG. 1, the surface of the metal wiring pattern 3 is easily exposed from the surface of the resin 5. In FIG. 11, an exposed portion 3A of the metal wiring pattern 3 is exposed from the surface of the resin 5. Even in the curing process of the resin 5 as shown in (e) in FIG. 1, and the separation process as shown in (f) in FIG. 1, the exposed portion 3A is kept exposed from the surface of the resin 5, thereby obtaining a buried wiring substrate 10 as a liquid crystal display device substrate. Therefore, when transparent electrodes 15 of, e.g., ITO films are formed on the wiring substrate 10, as indicated by alternate long and two dashed lines in FIG. 11, the transparent electrodes 15 and the metal wiring patterns 3 are electrically connected through the exposed portions 3A.

The exposed portion 3A may be formed on at least part of the surface of the metal wiring pattern 3. A surface roughness Rmax is preferably 50 to 800 Å. When the surface roughness Rmax of the exposed portion 3A is smaller than 50 Å, the projections of the surface of the exposed portion 3A become small. In the press process as shown in (d) in FIG. 1, the resin 5 is hardly removed from the exposed portion 3A, so the exposed portion 3A is hardly exposed from the surface of the resin 5. The viscosity of the resin 5 in the press operation as shown in (d) in FIG. 1 is preferably 100 cp or less. When the viscosity of the resin 5 in the press process as shown in (d) in FIG. 1 exceeds 100 cp, the fluidity of the resin decreases, so the resin 5 can hardly be removed from the exposed portion 3A in the press process.

The surface roughness of the exposed portion 3A and the viscosity of the resin 5 will be described later in Examples.

(Eleventh Embodiment)

FIG. 12 is a view for explaining a method of forming transparent electrodes 15 on a buried wiring substrate constituted as a liquid crystal display device substrate.

As described above, a substrate formed by removing a resin 5 from the surfaces of metal wiring patterns 3 on a glass substrate 2 is prepared ((a) in FIG. 12). A film 80 such as an ITO film for forming transparent electrodes 15 is formed on the surface of the resultant structure by sputtering ((b) in FIG. 12). After the resultant structure is coated with a photoresist 81, as shown in (c) in FIG. 12, a photomask 82 corresponding to the pattern shape of transparent electrodes 15 to be formed is used to perform mask exposure, as shown in (d) in FIG. 12. Development shown in (e) in FIG. 12, etching shown in (f) in FIG. 12, and removal of the photoresist 81 shown in (g) in FIG. 12 are performed, thereby forming transparent electrodes 15 having a predetermined pattern. This series of processes of forming transparent electrodes 15 can be sequentially performed using a film formation means, a photoresist coating means, a mask exposure means using a photomask, a development means, an etching means, and a photoresist removal means, as in the manufacture of a semiconductor device.

(Twelfth Embodiment)

Figure 13:
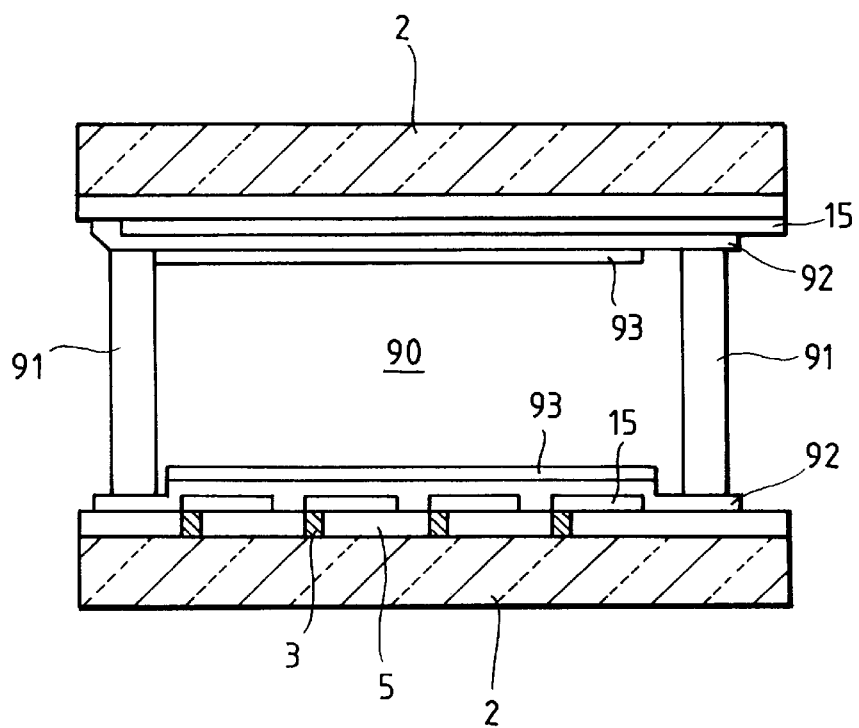
FIG. 13 is a schematic view of the structure of a liquid crystal display device according to the twelfth embodiment of the present invention.
Figure 12A:
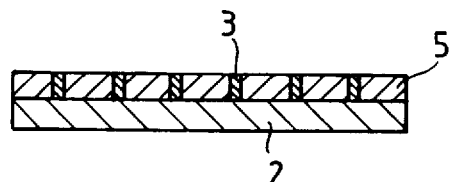
FIGS. 12a–12g an explanatory view of the process of a method of forming transparent electrodes according to the eleventh embodiment of the present invention.
Figure 12B:
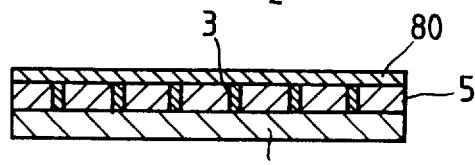
Figure 12C:
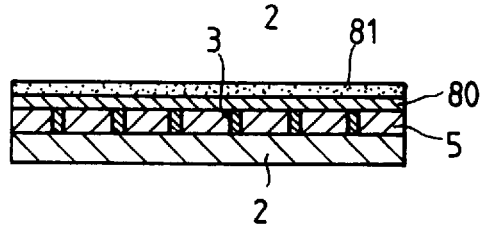
Figure 12D:
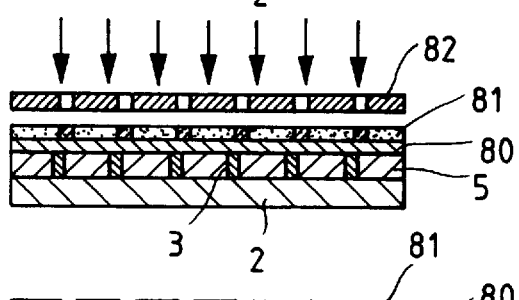
Figure 12E:
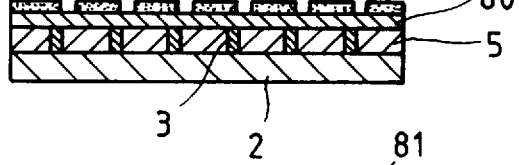
Figure 12F:
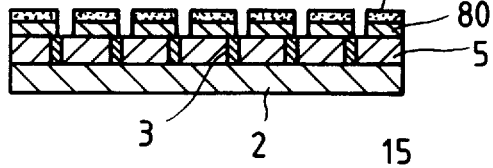
Figure 12G:
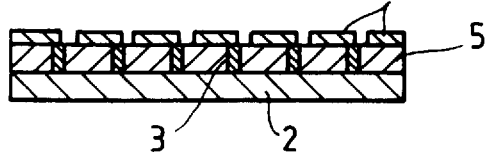

FIG. 13 is a view for explaining an example of the structure of a liquid crystal device using a substrate on which transparent electrodes 15 are formed, as shown in (g) in FIG. 12.

Referring to FIG. 13, a pair of upper and lower glass substrates 2 are joined through sealing members 91, and a ferroelectric liquid crystal 90 is held in the internal space. Metal wiring patterns 3, a resin 5, and striped transparent electrodes 15 are formed on each of the upper and lower glass substrates 2. In addition, an insulating film 92 and an alignment control film 93 are formed on the transparent electrodes 15. The liquid crystal display device having the above structure is driven by applying a predetermined voltage to the transparent electrodes 15 of the upper and lower glass substrates 2.

The present invention will be described below by way of its examples.

(EXAMPLE 1)

A stainless steel plate having dimensions of 300×350×5 (mm) was subjected to electroless plating to form a nickel layer having a thickness of about 50 μm on its surface. The surface was precision-ground to obtain a flatness of 5 μm, thereby preparing a mold 1. A UV curing resin composition as a resin 5 consisting of 50 parts by weight of pentaerythritol triacrylate, 50 parts by weight of neopentyl glycol diacrylate, and 2 parts by weight of 1-hydroxycyclohexyl phenylketone was dropped to the central portion of the mold 1 by using a dispenser 6.

Separately, an aluminum film having a thickness of 2 μm was formed by sputtering on the surface of a sodalime glass plate having dimensions of 300×350×1.1 (mm) and two surfaces polished. Photolithography/etching was performed to prepare a wiring substrate 4 having striped aluminum wiring patterns at a pitch of 320 μm and a wiring width of 20 μm. A coupling agent as a silane coupling agent consisting of 1 part by weight of A-174 (available from Nippon Uniker K.K.) and 40 parts by weight of ethyl alcohol was applied to the surface of the wiring substrate 4 by spin coating. A heat treatment was performed at 100° C. for 20 minutes, thereby performing a joining process.

The wiring substrate 4 was overlaid on the mold 1 on which the resin 5 was dropped such that the wiring surface of the wiring substrate 4 came into contact with the resin 5, and the structure was left to stand. Thereafter, a roll laminator machine which had, as rollers 7, two upper and lower metal rollers each having a width of 400 mm and a diameter of 130 mm, and a maximum load of 500 kg for each roller 7 was used. After one end portion of the integral structure of the mold 1 and the wiring substrate 4 was inserted between the upper and lower rollers 7, the structure was pressed at a roller speed of 20 mm/min and a pressure of about 5 kg/cm² at 25° C. Next, four 100 W high-pressure mercury lamps were used to irradiate UV light from the wiring substrate 4 side for two minutes. The integral structure of the wiring substrate 4 and the cured resin 5 was separated from the mold 1 by using a release jig, thereby preparing a buried wiring substrate as a liquid crystal display device substrate.

Figure 16A:
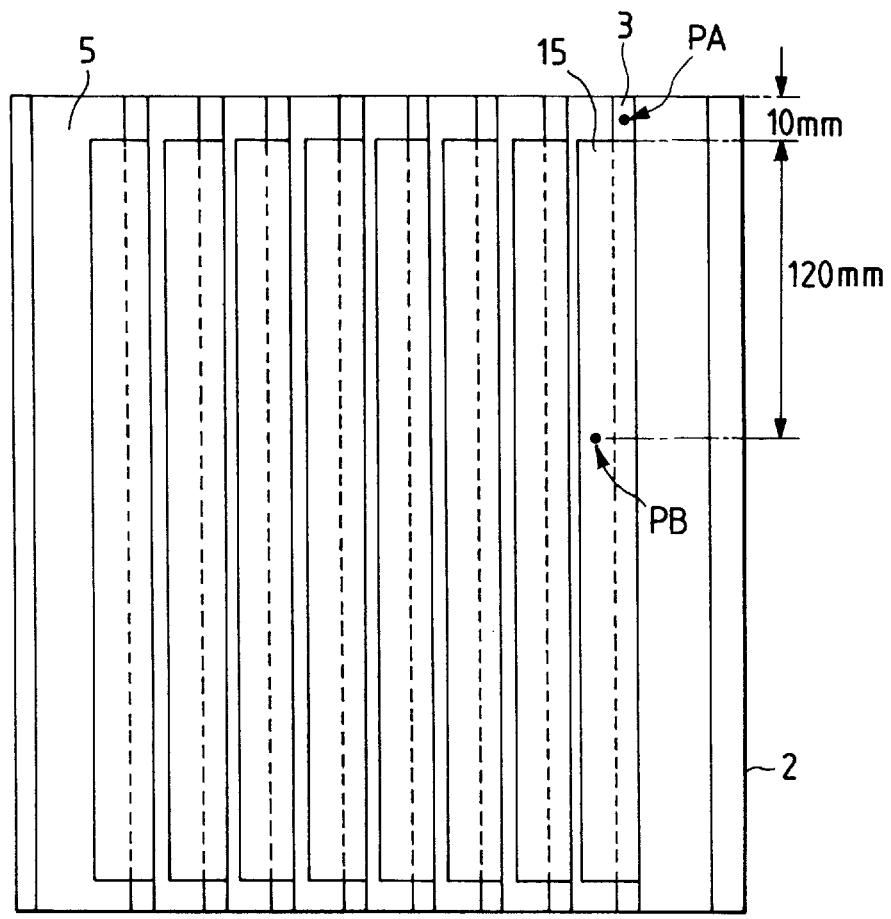
FIGS. 16A and 16B are a plan view and a side view, respectively, showing a substrate so as to explain a method of measuring the resistance values of electrode wiring patterns in Examples of the present invention.
Figure 16B:
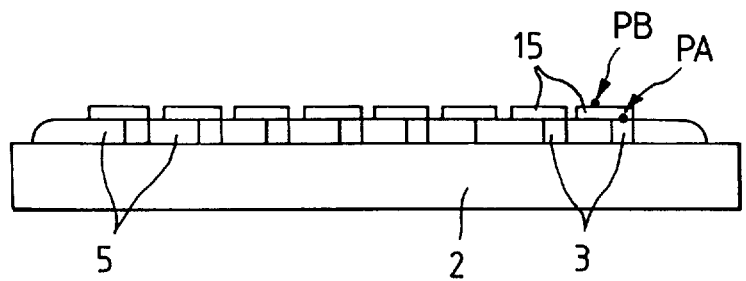

The contact resistances between transparent electrodes 15 of, e.g., ITO films formed in the subsequent process, as indicated by alternate long and two dashed lines in (g) in FIG. 1, and metal wiring patterns 3 were measured. For this purpose, electrode wiring patterns of the transparent electrodes 15 of ITO films having a pitch of 320 μm and a width of 300 μm were formed on the substrate 4 by film formation and photolithography/etching in correspondence with the aluminum wiring patterns 3 of the substrate 4. The electrode wiring patterns were formed in a 270×320 (mm) rectangular area at the central portion of the substrate 4 while excluding the peripheral portion having a width of 15 mm. The resistance value between a point PA on the metal wiring pattern 3 and a point PB on the electrode 15, which was 120 mm from the point PA, was measured for each of 18 electrode wiring patterns every 50 wiring patterns as shown in FIG. 16A. All the electrode wiring patterns exhibited a low resistance of 800Ω or less, indicating that a low-resistance wiring substrate without any defect was manufactured. Since the aluminum metal wiring pattern 3 alone has a resistance of about 500Ω, an electrode wiring pattern having a resistance of 800Ω or less was defined to have good electrical connection.

When 50 low-resistance wiring substrates were continuously manufactured, bubble formation in the resin 5 was observed in none of the substrates.

(Comparative Example 1)

As a Comparative Example to Example 1, the roller speed was set to be 40 mm/min, and electrode wiring patterns of, e.g., ITO were formed as in Example 1, and their resistance values were measured. Of 18 electrode wiring patterns measured, 15 wiring patterns exhibited a resistance value of 1 MΩ or more because pressing was locally insufficient.

(EXAMPLE 2)

A buried wiring substrate was prepared following the same procedures as in Example 1 except that a 300×350×1.1 (mm) sodalime glass plate having two surfaces polished was used as a mold 1.

As in Example 1, an ITO film serving as an electrode wiring layer was formed and patterned, and the resistance values were measured. All electrode wiring patterns measured exhibited a low resistance of 800Ω or less, showing that a low-resistance wiring substrate without any defect was manufactured. In addition, when 50 low-resistance wiring substrates were continuously manufactured, bubble formation in the resin 5 was observed in none of the substrates.

(EXAMPLE 3)

Contrary to Example 1, a resin 5 was dropped on a wiring substrate 4 side, and thereafter, a mold 1 was overlaid thereon. A buried wiring substrate was prepared according to the same procedures as in Example 1 except that point.

As in Example 1, an ITO film serving as an electrode wiring layer was formed and patterned, and the resistance values were measured. All electrode wiring patterns measured exhibited a low resistance of 800Ω or less, revealing that a low-resistance wiring substrate without any defect was manufactured. In addition, when 50 low-resistance wiring substrates were continuously manufactured, bubble formation in the resin 5 was observed in none of the substrates.

(EXAMPLE 4)

Before pressing using rollers 7 in Example 1, silicone rubber sheets 11 each having a thickness of 3 mm were set on the outer sides of a mold 1 and a wiring substrate 4, and the integral structure was inserted between the rollers 7. A buried wiring substrate was prepared according to the same procedures as in Example 1 except that point.

As in Example 1, an ITO film serving as an electrode wiring layer was formed and patterned, and the resistance values were measured. All electrode wiring patterns measured exhibited a low resistance of 800Ω or less, indicating that a low-resistance wiring substrate without any defect was manufactured. In addition, when 50 low-resistance wiring substrates were continuously manufactured, bubble formation in the resin 5 was observed in none of the substrates.

(EXAMPLE 5)

In place of the metal rollers 7 used in Example 1, rollers 7 each having a core 14 (FIG. 5) with a diameter of 110 mm and a silicone rubber layer 13 having a thickness of 10 mm and wound on the core 14 were used. A buried wiring substrate was prepared according to the same procedures as in Example 1 except that point.

As in Example 1, an ITO film serving as an electrode wiring layer was formed and patterned, and the resistance values were measured. All electrode wiring patterns measured exhibited a low resistance of 800Ω or less, showing that a low-resistance wiring substrate without any defect was manufactured. In addition, when 50 low-resistance wiring substrates were continuously manufactured, bubble formation in the resin 5 was observed in none of the substrates.

(EXAMPLE 6)

In the above-described Comparative Example 1, an electric heater was buried in each roller 7 in advance. The temperature of the rollers 7 was adjusted to about 70° C., and then, the integral structure of a mold 1 and a wiring substrate 4 was inserted between the rollers 7 and pressed. A buried wiring substrate was prepared according to the same procedures as in the Comparative Example described above except that point.

As in Example 1, an ITO film serving as an electrode wiring layer was formed and patterned, and the resistance values were measured. All electrode wiring patterns measured exhibited a low resistance of 800Ω or less, showing that a low-resistance wiring substrate without any defect was manufactured even at a high press speed.

(EXAMPLE 7)

In the above-described Comparative Example 1, before the integral structure of a mold 1 and a wiring substrate 4 was inserted between rollers 7, the integral structure as a target press object was heated on a hot plate at about 70° C. for about 10 minutes. A buried wiring substrate was prepared according to the same procedures as in the Comparative Example described above except that point.

As in Example 1, an ITO film serving as an electrode wiring layer was formed and patterned, and the resistance values were measured. All electrode wiring patterns measured exhibited a low resistance of 800Ω or less, showing that a low-resistance wiring substrate without any defect was manufactured even at a high press speed.

(EXAMPLE 8)

In Example 2, in place of the rollers 7, rollers similar to those in Example 5, i.e., rollers 7 each having a core 14 (FIG. 5) with a diameter of 110 mm and a silicone rubber layer 13 having a thickness of 10 mm and wound on the core 14 were used. Wiring patterns 3 of a wiring substrate 4 were formed in the following manner. An aluminum layer containing 1% of Si and 0.5% of Cu was formed to have a thickness of 2 μm by sputtering. As the sputtering condition, the substrate temperature was set to be 100° C. Under this sputtering condition, a surface roughness Rmax of the wiring pattern 3 was 50 Å. A buried wiring substrate was prepared according to the same procedures as in Example 2 except that point. The surface roughness of the wiring pattern 3 was measured by a feeler surface shape measurement device available from Tencole Co, Ltd. such that the surface roughness for a measurement length of 100 μm was measured using a feeler with a needle tip R of 5 μm.

As in Example 1, an ITO film serving as an electrode wiring layer was formed and patterned, and the resistance values were measured. All electrode wiring patterns measured exhibited a low resistance of 800Ω or less, revealing that a low-resistance wiring substrate without any defect was manufactured. This meant that an exposed portion 3A (FIG. 11) of the wiring pattern 3 was sufficiently exposed from the surface of a resin 5 so that proper electrical connection to an electrode 15 was attained. In addition, when 50 low-resistance wiring substrates were continuously manufactured, bubble formation in the resin 5 was observed in none of the substrates.

13

(EXAMPLE 9)

In Example 8, as the sputtering condition for forming wiring patterns 3, the substrate temperature was set to be 300° C. Under this sputtering condition, the surface roughness Rmax of the wiring pattern 3 was 400 Å. A buried wiring substrate was prepared according to the same procedures as in Example 8 except that point.

As in Example 1, an ITO film serving as an electrode wiring layer was formed and patterned, and the resistance values were measured. All electrode wiring patterns measured exhibited a low resistance of 800Ω or less, indicating that a low-resistance wiring substrate without any defect was manufactured. This meant that an exposed portion 3A (FIG. 11) of the wiring pattern 3 was sufficiently exposed from the surface of a resin 5 so that proper electrical connection to an electrode 15 was attained. In addition, when 50 low-resistance wiring substrates were continuously manufactured, bubble formation in the resin 5 was observed in none of the substrates.

(EXAMPLE 10)

In Example 8, as the sputtering condition for forming wiring patterns 3, the substrate temperature was set to be 400° C. Under this sputtering condition, the surface roughness Rmax of the wiring pattern 3 was 800 Å. A buried wiring substrate was prepared according to the same procedures as in Example 8 except that point.

As in Example 1, an ITO film serving as an electrode wiring layer was formed and patterned, and the resistance values were measured. All electrode wiring patterns measured exhibited a low resistance of 800Ω or less, showing that a low-resistance wiring substrate without any defect was manufactured. This meant that an exposed portion 3A (FIG. 11) of the wiring pattern 3 was sufficiently exposed from the surface of a resin 5 so that proper electrical connection to an electrode 15 was attained. In addition, when 50 low-resistance wiring substrates were continuously manufactured, bubble formation in the resin 5 was observed in none of the substrates.

(Comparative Example 2)

As a Comparative Example to Examples 8, 9, and 10, the sputtering condition for forming wiring patterns 3 in Example 8 was set such that the substrate temperature was set to be 80° C. Under this sputtering condition, the surface roughness Rmax of the wiring pattern 3 was 40 Å. A buried wiring substrate was prepared according to the same procedures as in Example 8 except that point.

As in Example 1, an ITO film serving as an electrode wiring layer was formed and patterned, and the resistance values were measured. Of 18 electrode wiring patterns measured, at least 15 wiring patterns exhibited an inappropriate resistance value of 1 MΩ or more. This meant that an exposed portion 3A (FIG. 11) of the wiring pattern 3 was not sufficiently exposed from the surface of a resin 5, and proper electrical connection to an electrode 15 was not attained on part of the substrate.

(Comparative Example 3)

As a Comparative Example to Examples 8,9, and 10, the sputtering condition for forming a wiring pattern 3 in Example 8 was set such that the substrate temperature was set to be 450° C. Under this sputtering condition, the surface roughness Rmax of the wiring pattern 3 was 900 Å. A buried wiring substrate was prepared according to the same procedures as in Example 8 except that point.

14

As in Example 1, an ITO film serving as an electrode wiring layer was formed and patterned, and the resistance values were measured. All electrode wiring patterns measured exhibited a low resistance value of 800Ω or less. However, when a liquid crystal panel as a liquid crystal display device was manufactured, a failure in crystal alignment was generated on the entire surface of the panel.

In manufacturing the liquid crystal panel, an ITO film serving as an electrode wiring layer was formed and patterned. An alignment film 93 (FIG. 13) of a polyimide was applied, and silica spacers were spread. As shown in FIG. 13, two such substrates were set to oppose each other such that their respective alignment films 93 were directed inward. The two substrates were bonded by applying a sealing compound to the periphery of the structure. An empty cell having a cell gap of 2 μm was formed upon hardening the sealing compound. Thereafter, a ferroelectric liquid crystal 90 was injected into the cell gap, thereby manufacturing a liquid crystal panel.

In evaluating the liquid crystal alignment, a voltage was applied to the ITO film serving as the electrode wiring layer of the liquid crystal panel, and the liquid crystal driven state was observed. As a result, a failure in liquid crystal orientation was observed between pixels on the entire panel surface. This is because the height of an exposed portion 3A (FIG. 11) of the wiring pattern 3 is too large, so an optimum uniformity of cell gaps cannot be obtained.

(Comparative Example 4)

As a Comparative Example to Examples 8, 9, and 10, the sputtering condition for forming a wiring pattern 3 in Example 8 was set such that the substrate temperature was set to be 425° C. Under this sputtering condition, the surface roughness Rmax of the wiring pattern 3 was 850 Å. A buried wiring substrate was prepared according to the same procedures as in Example 8 except that point.

As in Example 1, an ITO film serving as an electrode wiring layer was formed and patterned, and the resistance values were measured. All electrode wiring patterns measured exhibited a low resistance value of 800Ω or less. However, when a liquid crystal panel as a liquid crystal display device was manufactured as in Comparative Example 3, a failure in crystal orientation was observed between pixels on about 50% of the panel surface area. This is because, as in Comparative Example 3, the height of an exposed portion 3A (FIG. 11) of the wiring pattern 3 is too large, so an optimum uniformity of cell gaps cannot be obtained.

(EXAMPLE 11)

In Example 8 in which the surface roughness Rmax of the wiring pattern 3 was set to be 400 Å, the temperature of the rollers 7 for pressing the mold 1 and the wiring substrate 4, between which the resin 5 was sandwiched, as shown in (d) in FIG. 1, was set to be 43° C. When the rollers 7 were set at this temperature, the viscosity of the resin 5 in pressing was 100 cp. A buried wiring substrate was prepared according to the same procedures as in Example 8 except that point.

As in Example 1, an ITO film serving as an electrode wiring layer was formed and patterned, and the resistance values were measured. All electrode wiring patterns measured exhibited a low resistance of 800Ω or less, indicating that a low-resistance wiring substrate without any defect was manufactured. This meant that, when the resin 5 was pressed as shown in (d) in FIG. 1, the resin 5 having the viscosity of this example was removed from an exposed portion 3A (FIG. 11) of the wiring pattern 3, the exposed portion 3A was sufficiently exposed from the surface of the resin 5, and proper electrical connection to an electrode 15 was attained.

(EXAMPLE 12)

In Example 8 in which the surface roughness Rmax of the wiring pattern 3 was set to be 400 Å, the temperature of the rollers 7 for pressing the mold 1 and the wiring substrate 4, between which the resin 5 was sandwiched, as shown in (d) in FIG. 1, was set to be 150° C. When the rollers 7 were set at this temperature, the viscosity of the resin 5 in pressing was 12 cp. A buried wiring substrate was prepared according to the same procedures as in Example 8 except that point.

As in Example 1, an ITO film serving as an electrode wiring layer was formed and patterned, and the resistance values were measured. All electrode wiring patterns measured exhibited a low resistance of 800Ω or less, showing that a low-resistance wiring substrate without any defect was manufactured. This meant that, when the resin 5 was pressed as shown in (d) in FIG. 1, the resin 5 having the viscosity of this example was removed from an exposed portion 3A (FIG. 11) of the wiring pattern 3, the exposed portion 3A was sufficiently exposed from the surface of the resin 5, and proper electrical connection to an electrode 15 was attained.

(Comparative Example 5)

As a Comparative Example to Examples 11 and 12, in Example 8 in which the surface roughness Rmax of the wiring pattern 3 was set to be 400 Å, the temperature of rollers 7 for pressing the mold 1 and the wiring substrate 4, between which the resin 5 was sandwiched, as shown in (d) in FIG. 1, was set to be 160° C. When the rollers 7 were set at this temperature, the initial viscosity of the resin 5 in pressing was 10 cp. A buried wiring substrate was prepared according to the same procedures as in Example 8 except that point.

As in Example 1, an ITO film serving as an electrode wiring layer was formed and patterned, and the resistance values were measured. Of 18 electrode wiring patterns, at least four electrode wiring patterns exhibited an inappropriate resistance value of 1 MΩ or more. This meant that, when the resin 5 was pressed as shown in (d) in FIG. 1, heat polymerization commenced in the resin 5 with the viscosity of this Example at a high temperature of 160° C., and the viscosity increased with time. Therefore, the resin 5 was not removed from an exposed portion 3A (FIG. 11) of the wiring pattern 3, and the exposed portion 3A was not sufficiently exposed from the surface of the resin 5, so no proper electrical connection to an electrode 15 was attained.

(Validity Verification for Surface Roughness Range of Wiring Pattern 3)

Under the same conditions as those of Examples 8, 9, and 10, and Comparative Examples 2, 3, and 4, the surface roughness of a wiring pattern 3 was variously changed in accordance with the sputtering conditions for forming the wiring pattern 3, as shown in Table 1. The number of defective electrode wiring patterns which exhibited a resistance of 1 MΩ or more was checked. Under the respective conditions, 20 substrates were manufactured, and the ratio of N. G. was calculated. The viscosity of a resin 5 in pressing as shown in (d) in FIG. 1 was set to be 40 cp.

TABLE 1

| Surface roughness (Å) | Ratio of N.G. of 1 MΩ or more (%) |
| --- | --- |
| 0 | 100 |
| 40 | 80 |
| 50 | 40 |
| 100 | 10 |
| 200 | 0 |
| 400 | 0 |
| 600 | 0 |
| 800 | 0 |
| 850 | 0 |
| 900 | 0 |
| 1000 | 0 |

Figure 14A:
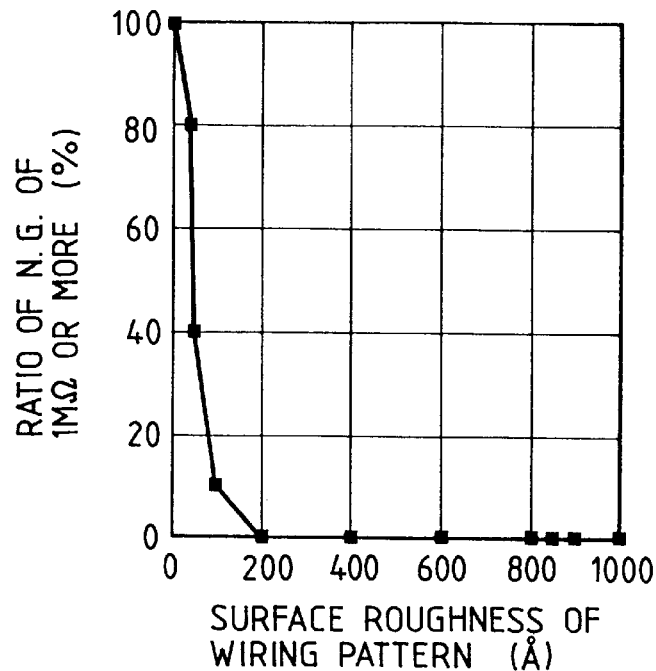
FIGS. 14A and 14B are graphs for verifying the validity of the surface roughness range of a conductive pattern according to the present invention.
Figure 14B:
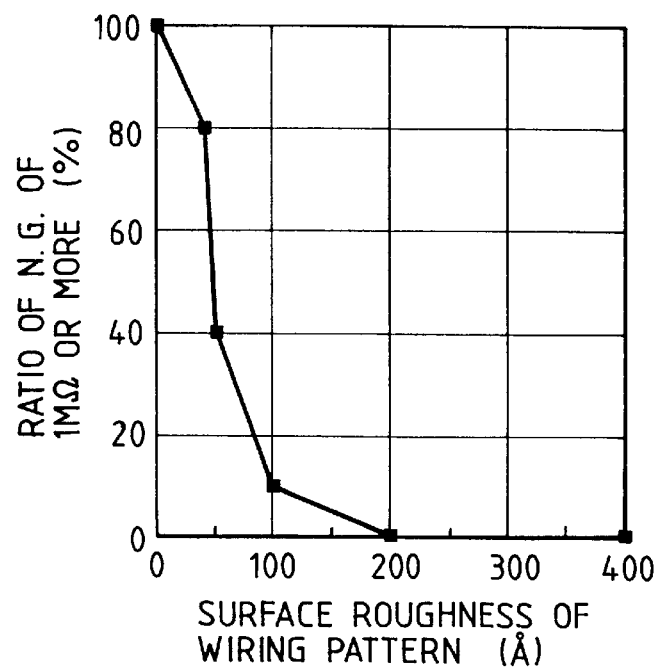

FIGS. 14A and 14B are graphs showing the ratio of N. G. of electrode wiring patterns which exhibited a resistance of 1 MΩ or more. These graphs verify that it is effective to set the surface roughness Rmax of the wiring pattern 3 to be 50 to 800 Å.

(Validity Verification for Viscosity Range of Resin 5 in Pressing)

Under the same conditions as those of Examples 11 and 12 and Comparative Example 5, the viscosity of the resin 5 in pressing as shown in (d) in FIG. 1 was variously changed in accordance with the temperature of the rollers 7, as shown in Table 2. The number of defective electrode wiring patterns which exhibited a resistance of 1 MΩ or more was checked. Under the respective conditions, 20 substrates were manufactured, and the number of N.G. was calculated. The viscosity of the resin 5 in pressing as shown in (d) in FIG. 1 was set to be 40 cp. The surface roughness Rmax of a wiring pattern 3 was set to be 400 Å.

TABLE 2

| Viscosity of resin (cp) | Ratio of N.G. of 1 MΩ or more (%) | Temperature of resin (°C.) |
| --- | --- | --- |
| 1000 | 100 | 19 |
| 500 | 80 | 25 |
| 250 | 10 | 33 |
| 150 | 3 | 37 |
| 100 | 0 | 43 |
| 60 | 0 | 50 |
| 40 | 0 | 57 |
| 20 | 0 | 72 |
| 10 | 0 | 160 |

Figure 15A:
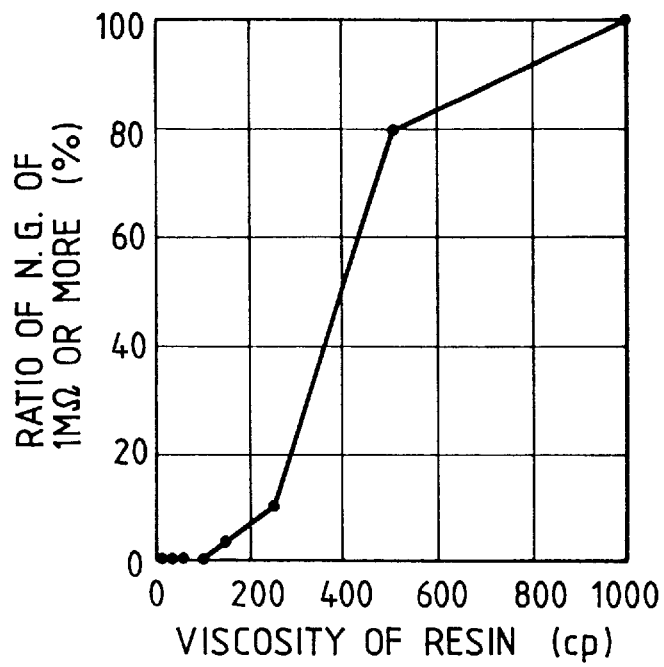
FIGS. 15A and 15B are graphs for verifying the validity of the viscosity range of a resin in pressing according to the present invention.
Figure 15B:
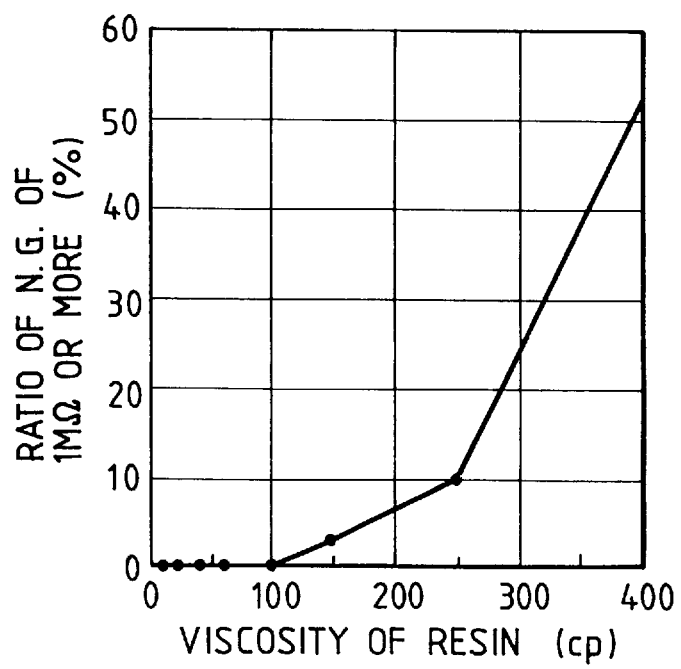

FIGS. 15A and 15B are graphs showing the ratio of N.G. of electrode wiring patterns which exhibited a resistance of 1 MΩ or more. These graphs verify that it is effective to set the viscosity of the resin 5 to be 100 cp or less upon pressing in (d) in FIG. 1.

According to the present invention, a liquid resin material is set between the surface of a substrate on which conductive patterns are formed and the flat surface of a mold substrate. The resultant structure is substantially linearly pressed to bring them into contact with each other, and the pressed portion is moved from one side of the integral structure of the substrate and the mold substrate to the other side. With this operation, the resin material is efficiently spread between the substrate and the mold substrate while preventing bubble or cell formation in the resin. In addition, the resin is removed from the surface of the conductive pattern. At least part of the surface of the conductive pattern is exposed to achieve proper connection to a transparent electrode. With this arrangement, the manufacturing time of a liquid crystal device substrate can be shortened, and the yield can be increased, resulting in an improvement of productivity. Since the pressure necessary for spreading the resin material is small, manufacturing with a simple and inexpensive apparatus can be realized. As a result, high-speed drive of a liquid crystal panel display can be achieved by decreasing the resistance of the transparent electrode formed on the conductive pattern, and at the same time, cost reduction of a liquid crystal panel can be realized.

When the substrate and the mold substrate are pressed using rollers, proper pressing can be realized regardless of the thickness of the mold substrate.

When the substrate and the mold substrate are pressed through an elastic body, cracking of the substrate can be prevented. In addition, a liquid crystal display device substrate having a more uniform flat surface can be manufactured.

When the substrate and the mold substrate are heated in pressing, the press time can be further shortened.

When a substrate with a color filter is used, a liquid crystal device substrate having a color filter function can be manufactured. For example, a color liquid crystal display panel can be manufactured, and at the same time, high-speed drive of a liquid crystal panel display can be achieved by decreasing the resistance of the transparent electrode.

The surface roughness Rmax of the conductive pattern is set to be 50 to 800Ω, or the viscosity of the resin material to be pressed between the substrate and the mold substrate is set to be 100 cp or less. Under these conditions, when the resin material is pressed between the substrate and the mold substrate, the surface of the conductive pattern is properly exposed from the surface of the resin material, or the resin material can be properly removed from the surface of the conductive pattern. As a result, the conductive pattern and an electrode formed thereon can be further properly electrically connected to each other.

What is claimed is:

1. A liquid crystal device substrate in which conductive patterns formed on a surface of a transparent substrate are buried flat with a resin material, wherein said resin material comprises a cured liquid resin material, and said liquid resin material is set between a flat surface of a mold substrate and said surface of said substrate, spread when said mold substrate and said substrate are substantially linearly pressed, and a pressed portion is moved from one side of an integral structure of said mold substrate and said substrate to the other side, and then cured, thereby forming said resin material upon separating said mold substrate, wherein said substrate comprises a glass substrate in which color filter layers are formed under said conductive patterns.

2. A liquid crystal device substrate in which conductive patterns formed on a surface of a transparent substrate are buried flat with a resin material, wherein said resin material comprises a cured liquid resin material, and said liquid resin material is set between a flat surface of a mold substrate and said surface of said substrate, spread when said mold substrate and said substrate are substantially linearly pressed, and a pressed portion is moved from one side of an integral structure of said mold substrate and said substrate to the other side, and then cured, thereby forming said resin material upon separating said mold substrate, wherein said substrate comprises a glass substrate having a protective layer formed on color filter layers formed on said surface, and said conductive patterns are formed on said protective layer.

3. A substrate according to claim 2, wherein said resin material comprises an ultraviolet curing resin material.

4. A substrate according to claim 3, wherein said conductive pattern has an exposed portion electrically connectable to an electrode formed on a surface of said resin material.

5. A substrate according to claim 4, wherein a surface roughness of said exposed portion corresponds to a maximum height Rmax of 50 to 800 Å.

6. A substrate according to claim 5, wherein a viscosity of said resin material in pressing is not more than 100 cp.

7. A method of manufacturing a liquid crystal device substrate in which conductive patterns formed on a surface of a transparent substrate are buried flat with a resin material, comprising the steps of:

preparing a mold substrate having a flat surface;

setting a liquid resin material between said surface of said substrate having said conductive patterns formed thereon and said surface of said mold substrate;

substantially linearly pressing said substrate and said mold substrate to bring them into contact with each other, and moving a pressed portion from one side of an integral structure of said substrate and said mold substrate to the other side to join said substrate to said mold substrate; and curing said liquid resin material and then separating said mold substrate, wherein the step of setting said liquid resin material between said surface of said substrate and said surface of said mold substrate includes the steps of mounting said liquid resin material on said surface of said mold substrate and then joining said surface of said substrate to said surface of said mold substrate.

8. A method according to claim 7, wherein the step of joining said substrate to said mold substrate includes the step of heating said pressed portion of at least one of said substrate and said mold substrate.

9. A method according to claim 8, further comprising, before the step of joining said substrate to said mold substrate, the step of heating said substrate in advance.

10. A method according to claim 9, wherein the step of joining said substrate to said mold substrate includes the step of pressing a rear surface of at least one of said substrate and said mold substrate by a roller while moving said roller relative to said substrate and said mold substrate.

11. A method according to claim 10, wherein an elastic sheet is inserted between said roller and said rear surface of said substrate or/and said rear surface of said mold substrate.

12. A method according to claim 10, wherein an elastic body is arranged on an outer surface of said roller.

13. A method according to claim 12, wherein said roller presses said rear surface of said substrate or/and said rear surface of said mold substrate while generating heat.

14. A method according to claim 7, wherein said substrate comprises a glass substrate in which color filter layers are formed under said conductive patterns.

15. A method according to claim 14, wherein said substrate comprises a glass substrate having a protective layer formed on color filter layers formed on said surface, and said conductive patterns are formed on said protective layer.

16. A method according to claim 15, wherein said resin material comprises an ultraviolet curing resin.

17. A method according to claim 16, wherein said substrate and said mold substrate are joined at a pressure of 0.2 to 30 kg/cm$^2$.

18. A method according to claim 17, wherein said resin material comprises an ultraviolet curing resin, and the step of joining said substrate to said mold substrate includes the step of heating at least one of said substrate and said mold substrate up to 150° C.

19. A method according to claim 18, wherein the step of joining said substrate to said mold substrate includes the step of exposing at least part of a surface of said conductive pattern from a surface of said resin material before curing to form an exposed portion, and the step of curing said resin material includes the step of keeping said exposed portion of said conductive pattern exposed.

20. A method according to claim 19, wherein a surface roughness of said exposed portion corresponds to a maximum height Rmax of 50 to 800 Å.

21. A method according to claim 20, wherein a viscosity of said resin material in pressing is not more than 100 cp.

22. An apparatus for manufacturing a liquid crystal device substrate in which conductive patterns formed on a surface of a transparent substrate are buried flat with a resin material, comprising:

a first operation mechanism for setting a liquid resin material between said surface of said substrate having said conductive patterns formed thereon and a flat surface of a mold substrate;

A second operation mechanism for substantially linearly pressing said substrate and said mold substrate, between which said liquid resin material is sandwiched, to bring them into contact with each other, and moving a pressed portion from one side of an integral structure of said substrate and said mold substrate to the other side to join said substrate to said mold substrate;

a third operation mechanism for curing said liquid resin material between said substrate and said mold substrate, which are joined to each other; and a fourth operation mechanism for separating said mold substrate after said resin material is cured;

wherein said first operation mechanism mounts said liquid resin material on said surface of said mold substrate and then joins said surface of said substrate to said surface of said mold substrate.

23. An apparatus for manufacturing a liquid crystal device substrate in which conductive patterns formed on a surface of a transparent substrate are buried flat with a resin material, comprising:

a first operation mechanism for setting a liquid resin material between said surface of said substrate having said conductive patterns formed thereon and a flat surface of a mold substrate;

second operation mechanism for substantially linearly pressing said substrate and said mold substrate, between which said liquid resin material is sandwiched, to bring them into contact with each other, and moving a pressed portion from one side of an integral structure of said substrate and said mold substrate to the other side to join said substrate to said mold substrate;

a third operation mechanism for curing said liquid resin material between said substrate and said mold substrate, which are joined to each other; and a fourth operation mechanism for separating said mold substrate after said resin material is cured, wherein said second operation mechanism comprises a roller for pressing a rear surface of at least one of said substrate and said mold substrate and a mechanism for moving said roller relative to said substrate and said mold substrate.

24. An apparatus according to claim 23, wherein said roller has an elastic body arranged on an outer surface.

25. An apparatus according to claim 23, wherein said second operation mechanism comprises heating means for heating said roller.

26. An apparatus according to claim 25, wherein said second operation mechanism comprises heating means for heating said substrate before pressing said substrate and said mold substrate.

27. An apparatus according to claim 26 wherein said second operation mechanism joins said substrate to said mold substrate at a pressure of 0.2 to 30 kg/cm$^2$.

28. An apparatus according to claim 27, wherein said first operation mechanism sets, as said resin material, an ultraviolet curing resin between said surface of said substrate and said surface of said mold substrate; and said second operation mechanism comprises heating means for heating at least one of said substrate and said mold substrate up to 150° C. before pressing said substrate and said mold substrate.

29. An apparatus according to claim 28, wherein said second operation mechanism exposes at least part of a surface of said conductive pattern from a surface of said resin material before curing to form an exposed portion before joining said substrate to said mold substrate, and said third operation mechanism keeps said exposed portion of said conductive pattern exposed in curing said resin material.

30. An apparatus according to claim 29, wherein said second operation mechanism comprises heating means for setting a viscosity of said resin material to be not more than 100 cp in pressing said substrate and said mold substrate.

31. A method of manufacturing a liquid crystal device substrate in which a transparent electrode is formed on a conductive pattern formed on a transparent substrate and electrically connected to said conductive pattern, comprising the steps of:

mounting a liquid resin material on said substrate having said conductive pattern formed thereon;

performing pressing by a roller to remove said resin material on said conductive pattern and form an exposed portion on at least part of a surface of said conductive pattern; and curing said resin material and then forming said transparent electrode to be electrically connected to said exposed portion of said conductive pattern.

* * * * *

UNITED STATES PATENT AND TRADEMARK OFFICE
CERTIFICATE OF CORRECTION

PATENT NO. : 5,838,409

DATED : November 17, 1998

INVENTOR(S): HARUO TOMONO ET AL.

It is certified that error appears in the above-identified patent and that said Letters Patent is hereby corrected as shown below:

<u>COLUMN 4</u>

Line 55, "12a-12g-- should read --12a-12g are--;

<u>COLUMN 6</u>

Line 12, "tipically" should read --typically--;

<u>COLUMN 8</u>

Line 22, "is" (first occurrence) should read --are--;

<u>COLUMN 17</u>

Line 25, "800$\Omega$," should read --800Å,--;

UNITED STATES PATENT AND TRADEMARK OFFICE
CERTIFICATE OF CORRECTION

PATENT NO. : 5,838,409

DATED : November 17, 1998

INVENTOR(S) : HARUO TOMONO ET AL.

It is certified that error appears in the above-identified patent and that said Letters Patent is hereby corrected as shown below:

<u>COLUMN 19</u>

Line 27, "A" should read --a--.

Signed and Sealed this

Thirty-first Day of August, 1999

*Attest:*

Q. TODD DICKINSON

*Attesting Officer*   *Acting Commissioner of Patents and Trademarks*